United States Patent
Tanamoto et al.

[11] Patent Number: 5,877,511
[45] Date of Patent: Mar. 2, 1999

[54] SINGLE-ELECTRON CONTROLLING MAGNETORESISTANCE ELEMENT

[75] Inventors: Tetsufumi Tanamoto, Kawasaki; Shuichi Iwabuchi, Nara, both of Japan

[73] Assignee: Kabushiki Kaisha Toshiba, Kawasaki, Japan

[21] Appl. No.: 940,194

[22] Filed: Sep. 29, 1997

[30] Foreign Application Priority Data

Sep. 30, 1996 [JP] Japan .................................. 8-259858

[51] Int. Cl.⁶ ............................. H01L 29/06; H01L 39/00
[52] U.S. Cl. ............................................... 257/30; 257/421
[58] Field of Search .................................. 257/25, 421, 30

[56] References Cited

U.S. PATENT DOCUMENTS 5,581,091 12/1996 Moskovits .................................. 257/30
5,757,056 5/1998 Chui .

OTHER PUBLICATIONS

ONO et al.; "Magnetoresistance of Ni/NiO/Co Small Tunnel Junctions in Coulomb Blockade Regime"; Journal of the Physical Society of Japan vol. 65 No. 11, Nov. 1996, pp. 3449–3451.

*Primary Examiner*—Tom Thomas
*Assistant Examiner*—William Hughes
*Attorney, Agent, or Firm*—Finnegan, Henderson, Farabow, Garrett & Dunner, L.L.P.

[57] ABSTRACT

A single-electron controlling magnetoresistance element which comprises, a couple of first ferromagnetic bodies each magnetized in a first direction, a second ferromagnetic body magnetized in a second direction in an initial direction and sandwiched between the couple of first ferromagnetic bodies with a tunnel junction interposed therebetween respectively, and means for directing the magnetization direction of the second ferromagnetic body to a direction different from the second direction, wherein a charging energy $E_c$ of a single electron in at least one of the tunnel junctions interposed between the first ferromagnetic body and the second ferromagnetic body meets the following conditions:

$$E_c >> k_B T \quad (2)$$

$$E_c >> h/R_t C \quad (3)$$

wherein $k_B T$ is a thermal energy at an operation temperature, h is a Planck's constant, $R_t$ is a junction tunnel resistance, and C is a junction capacity.

31 Claims, 11 Drawing Sheets

SINGLE-ELECTRON CONTROLLING MAGNETORESISTANCE ELEMENT

BACKGROUND OF THE INVENTION

This invention relates to a single-electron controlling magnetoresistance element, and in particular to an element which functions based on a novel single-electron controlling method taking advantages of a charging energy effect or so-called coulomb blockade and of a negative magnetoresistance effect of a ferromagnetic tunnel junction.

Attempts to further increase the integration of elements based on the conventional Si-MOSFET are now confronted with a fundamental difficulty due to an increasing complication of structure resulting from an increasing miniaturization of device as well as due to difficulty in fine working for manufacturing such a miniature device. Under the circumstances, there is a growing need for a development of an element which is simple in structure and hence suited for use in miniaturizing and integrating a device. As one example of element to meet such a need, a single-electron tunnel element which functions based on an operational principle of so-called coulomb blockade has been proposed (K. K. Likharev, IBM J. Res. Develop., 32,144(1988)).

When the tunneling of a single electron (an electric charge "e") takes place through a single tunnel junction (a junction capacity: C; a junction tunnel resistance: $R_t$), a change in electrostatic energy before and after the tunneling, which is represented by the following formula (1), becomes a problem.

$$E_c = e^2/2C \quad (1)$$

The change in electrostatic energy $E_c$ may become larger than a thermal energy in an ultra-fine tunnel junction where the junction capacity "C" thereof is very small. Depending on the magnitude of quantity of electrification at this junction, even the tunneling of a single electron is forbidden because of such a high energy to be generated by the tunneling of a single electron. This phenomenon is called coulomb blockade (K. K. Likharev, IBM J. Res. Develop., 32,144(1988)), wherein the tunneling of electron is expected to be taken place one by one like a particle, in spite of the fact that this tunneling phenomenon is essentially brought about by the wave motion of electron.

In order to render this coulomb blockade to be clearly revealed, the change in electrostatic energy $E_c$ is required to be sufficiently larger than any of thermal fluctuation and quantum mechanical fluctuation. These conditions can be expressed by the following formulas (2) and (3).

$$E_c >> k_B T \quad (2)$$

$$E_c >> h/R_t C \quad (3)$$

The condition represented by the formula (3) may be written also by the following formula (4).

$$R_q << R_t \quad (4)$$

wherein $R_q$ is quantum resistance which can be expressed by the following formula (5).

$$R_q \equiv h/(2e^2) = 12.9 \ k\Omega \quad (5)$$

wherein h is Planck's constant.

In the case of the ordinary single-electron controlling element, it is essential that the quantum fluctuation is completely suppressed, and, in view of the aforementioned formula (4), the tunnel resistance $R_t$ is required to be set sufficiently higher than the quantum resistance $R_q$.

The single-electron controlling element may be formed, as a basic structure, of; a double tunnel junction provided with a tunnel barrier layer which is constituted by a channel electron layer pinched off electrostatically from an electrode formed of a semiconductor or a normal conductive metal, or by an insulating body; and a gate electrode which is disposed facing to the central electrode (hereinafter referred to as an island) and capacitively coupled with the central electrode (SET transistor). Alternatively, the single-electron controlling element may be formed, as a basic structure, of a gate capacitor which is serially connected to the aforementioned double tunnel junction (SET memory). FIGS. 1A and 1B, and FIGS. 2A and 2B respectively represent examples of the structure and characteristics of these conventional single-electron controlling elements (K. K. Likharev, IEEE Trans. Magn., 23,1142(1987)). Specifically, FIG. 1A represents a circuit diagram of the C-SET, FIG. 1B represents characteristics of the C-SET, FIG. 2A represents a circuit diagram of the R-SET, and FIG. 2B represents characteristics of the R-SET. The control of single-electron is performed mainly by way of a gate, i.e. by changing an excessive electron generated at the island due to the tunneling of electron.

Since the single-electron controlling element is simple in structure, it is suited for use in miniaturizing and integrating a device. Additionally, the performance of the single-electron controlling element can be further improved with an increase in miniaturization. Moreover, since the control of the single-electron controlling element can be performed based on a single electron, a clear on/off operation can be achieved, so that the single-electron controlling element is now considered as one of promising elements in future.

However, there is a problem that although the operation of this single-electron controlling element is based on a mode where the coulomb blockade can be completely taken place all over the element, it is difficult as a matter of fact to completely render the coulomb blockade to take place all over the element of high integration. In other words, there has been no idea of positively utilize a non-linear mode wherein the coulomb blockade takes place incompletely. Further, the operational principle that has been conventionally considered of is based only on the electric charge of electron, and the utilization of effects that will be generated from the degree of freedom of spin has not been considered. Namely, a diversified control of the element is not fully taken into account up to date.

On the other hand, the ferromagnetic tunnel junction, which is one of the fundamental structural element of the conventional magnetic elements, is constructed as shown in FIG. 3 (S. Maekawa and U. Gafvert, IEEE Mag. MAG-18 707(1982)). Referring to FIG. 3, the reference numeral 71 represents a first ferromagnetic electrode formed of Co, and 72 represents a second ferromagnetic electrode formed of Ni, which is connected via a tunnel barrier 73 (formed of NiO) with the first ferromagnetic electrode 71. This conventional magnetic element has characteristics as shown by a diagram shown in FIG. 4. Since the state density in the ferromagnetic substance is dependent on the orientation of spin, the generation of a negative tunnel magnetic reluctance can be generally represented by the following formula (6).

$$R_T = \frac{R_q}{2\pi^2 (D_\uparrow^{(1)}(0) D_\uparrow^{(2)}(0) + D_\downarrow^{(1)}(0) D_\downarrow^{(2)}(0))|T|^2} \quad (6)$$

It is assumed that the generation of a negative tunnel magnetic reluctance is brought about by a change in state density due to the reversal of magnetization (inverse-parallel to parallel) by a magnetic field. This structure is more advantageous in the respect that the SN ratio thereof is larger than the multi-layered structure consisting of a magnetic layer/a non-magnetic layer/a magnetic layer, which is another example of structure exhibiting the same negative magnetic reluctance as mentioned above. However, since the rate of change of magnetic reluctance is only 15% or so in the ferromagnetic tunnel junction shown in FIG. 3, a structure which is capable of exhibiting a larger change in magnetic reluctance is now desired. Furthermore, since the aforementioned conventional structure is formed of a single tunnel junction structure to be driven with a low impedance and exhibits a phenomenon called "an environmental effect of electromagnetic field" against the coulomb blockade, a large fluctuation is caused to generate in electric charge. Due to these reasons, it is very difficult to take advantage of the coulomb blockade as the operational principle of the single-electron controlling element even if the area of tunnel junction is further minimized (S. Iwabuchi, H. Higurashi, Y. Nagaoka, JJAP Series 9, 126(1992); H. Higurashi, S. Iwabuchi and Y. Nagaoka, Phys., Rev. B51, 2387(1995)).

It would be impossible in the conventional magnetic element as shown in FIG. 3 to expect the coulomb blockade to be brought about by the effect of charging energy. However, there is a need to further promote the integration of semiconductor elements in concurrent with an effort to achieve an increased miniaturization of element which can be competitive with or replaceable for the existing silicon element in future. Therefore, it is not unreasonable to find a way to effectively utilize the coulomb blockade even in a magnetic element. Accordingly, if a basic element structure/operational mode which takes full advantage of the coulomb blockade can be realized, it is expected that not only the performance of unit element can be improved, but also the freedom in design of the whole system can be expanded.

BRIEF SUMMARY OF THE INVENTION

This invention has been achieved with a view to overcome the drawbacks of conventional technique, and therefore an object of the present invention is to provide a single-electron controlling magnetoresistance element having an element structure/operational mode which is capable of achieving an enhanced performance through an increased miniaturization and integration as compared with the existing semiconductor element.

Namely, according to the present invention, there is provided a single-electron controlling magnetoresistance element which comprises;

a couple of first ferromagnetic bodies each magnetized in a first direction;

a second ferromagnetic body magnetized in a second direction in an initial direction and sandwiched between the couple of first ferromagnetic bodies with a tunnel junction interposed therebetween respectively; and means for directing the magnetization direction of the second ferromagnetic body to a direction different from the second direction;

wherein a charging energy $E_c$ of a single electron in at least one of the tunnel junctions interposed between the first ferromagnetic body and the second ferromagnetic body meets the following conditions:

$$E_c >> k_B T \quad (2)$$

$$E_c >> h/R_t C \quad (3)$$

wherein $k_B T$ is a thermal energy at an operation temperature, h is a Planck's constant, $R_t$ is a junction tunnel resistance, and C is a junction capacity.

According to the present invention, there is further provided a single-electron controlling magnetoresistance element which comprises;

a couple of first ferromagnetic bodies each magnetized in a first direction;

a second ferromagnetic body magnetized in a second direction in an initial direction and sandwiched between the couple of first ferromagnetic bodies;

a tunnel junction disposed on one side of the second ferromagnetic body which faces one of the first ferromagnetic bodies; and means for directing the magnetization direction of the second ferromagnetic body to a direction different from the second direction;

wherein a charging energy $E_c$ of a single electron in the tunnel junction interposed between the first ferromagnetic body and the second ferromagnetic body meets the following conditions:

$$E_c >> k_B T \quad (2)$$

$$E_c >> h/R_t C \quad (3)$$

wherein $k_B T$ is a thermal energy at an operation temperature, h is a Planck's constant, $R_t$ is a junction tunnel resistance, and C is a junction capacity.

Further, according to the present invention, there is also provided a single-electron controlling magnetoresistance element which comprises;

a couple of first ferromagnetic bodies each magnetized in a first direction;

a second ferromagnetic body magnetized in a second direction opposite to the first direction and sandwiched between the couple of first ferromagnetic bodies with a tunnel junction interposed therebetween respectively; and magnetization-inversion means disposed on the second ferromagnetic body for inverting the magnetization direction of the second ferromagnetic body so as to direct the magnetization direction of the second direction in the same direction as that of the first direction;

wherein a charging energy $E_c$ of a single electron in at least one of the tunnel junctions interposed between the first ferromagnetic body and the second ferromagnetic body meets the following conditions, and a tunnel resistance at each tunnel junction is in the range of 13 kΩ to 150 kΩ:

$$E_c >> k_B T \quad (2)$$

$$E_c >> h/R_t C \quad (3)$$

wherein $k_B T$ is a thermal energy at an operation temperature, h is a Planck's constant, $R_t$ is a junction tunnel resistance, and C is a junction capacity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

This invention will be further explained in detail as follows.

This invention is intended to take advantage of an increase in a negative tunnel magnetoresistance of a ferromagnetic tunnel junction under a condition where a coulomb blockade is incompletely functioned so as to generate a non-linearity in current voltage characteristics.

This invention will be now explained taking as an example a double tunnel junction array, which is one of most simple tunnel junction arrays. A main point that distinguishes the single-electron controlling magnetoresistance element of this invention in construction from the conventional single-electron controlling magnetoresistance element based on coulomb blockade is that a ferromagnetic substance is employed as an electrode in this invention, thus giving rise to a polarization of spin. On the other hand, a main point that distinguishes the single-electron controlling magnetoresistance element of this invention in construction from the conventional ferromagnetic tunnel junction element based on coulomb blockade is that the structure of the element according to this invention is of a multi-ply (i.e. 2-ply or more) tunnel junction and that, since each tunnel junction is ultra-fine, the coulomb blockade is revealed by a charging energy $E_c$ in the tunneling of electron. In this case, the current of the tunnel junction array that can be actually measured can be obtained, theoretically speaking, by imposing a condition of sequential current on the current passing through a couple of tunnel junctions.

Figure 1A:
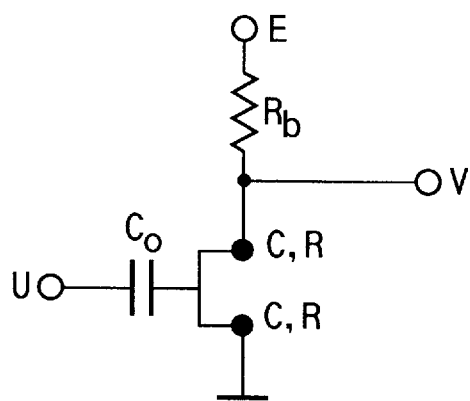
FIG. 1A is a circuit diagram illustrating one example of the conventional single-electron controlling magnetoresistance element.
Figure 1B:
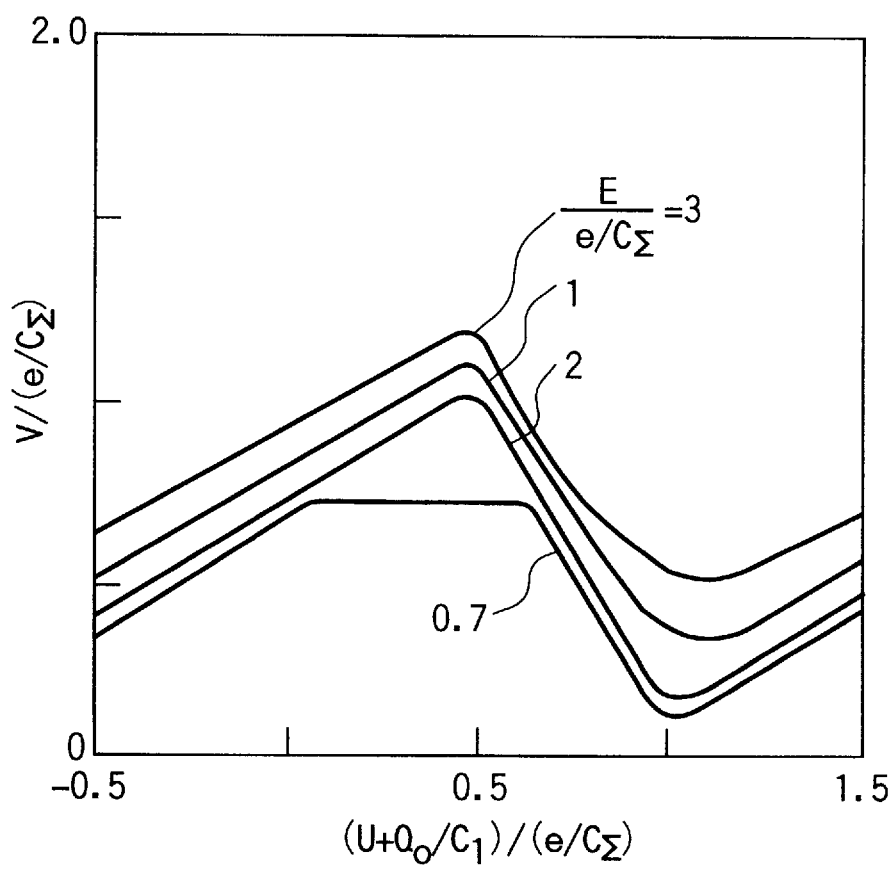
FIG. 1B is a graph illustrating the characteristics of the conventional single-electron controlling magnetoresistance element.
Figure 2A:
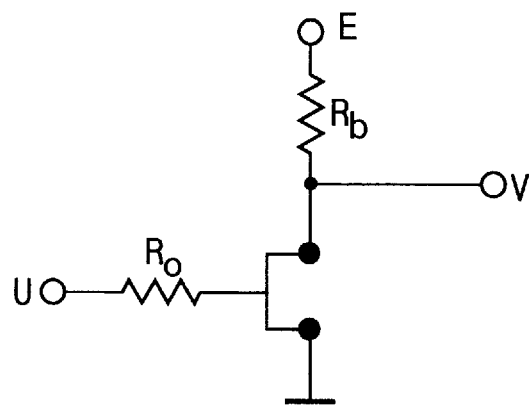
FIG. 2A is a circuit diagram illustrating one example of the conventional single-electron controlling magnetoresistance element.
Figure 2B:
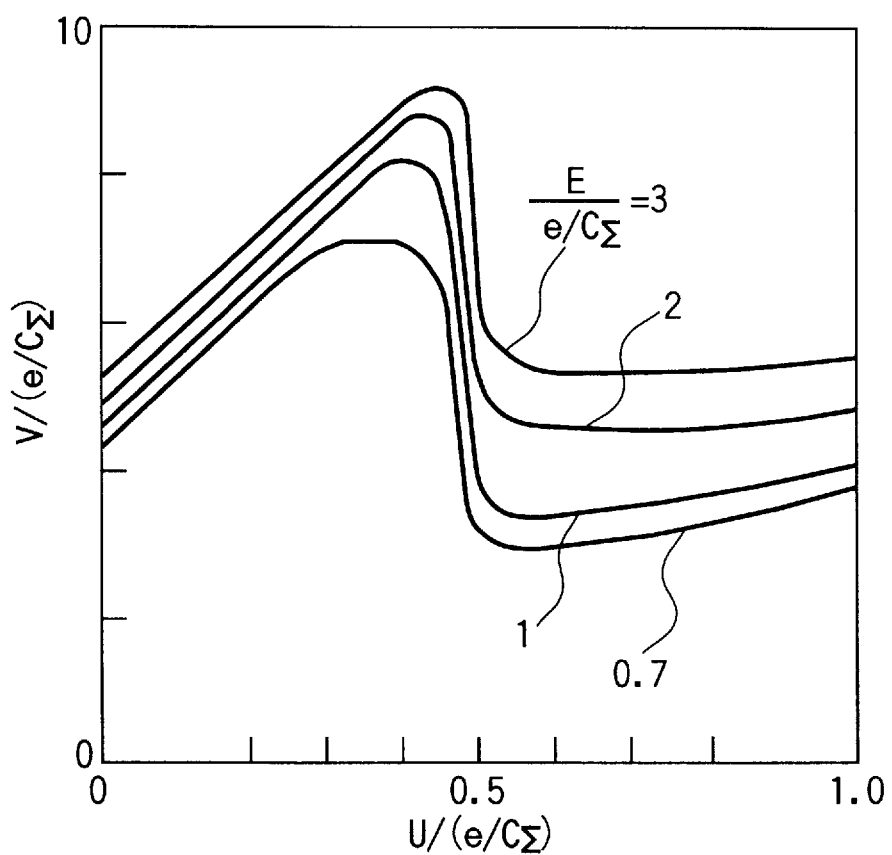
FIG. 2B is a graph illustrating the characteristics of the conventional single-electron controlling magnetoresistance element.
Figure 3:
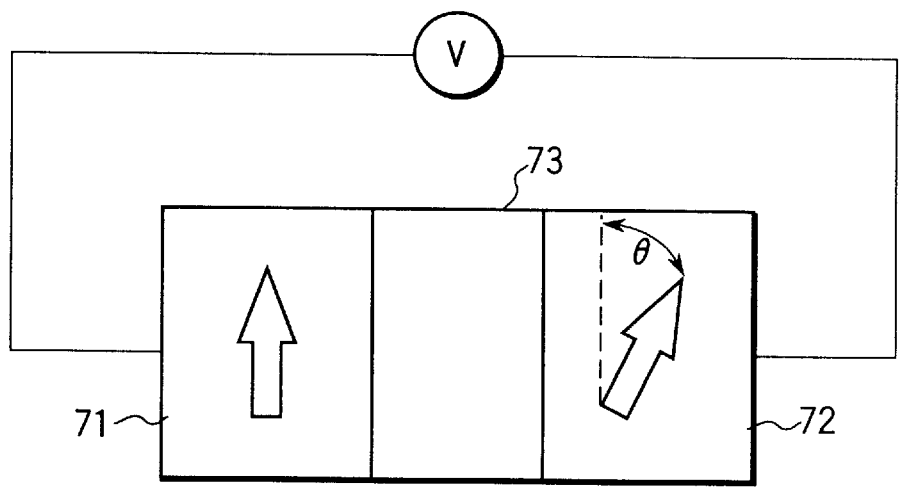
FIG. 3 is a schematic view showing the structure of the conventional ferromagnetic tunnel junction element.
Figure 4:
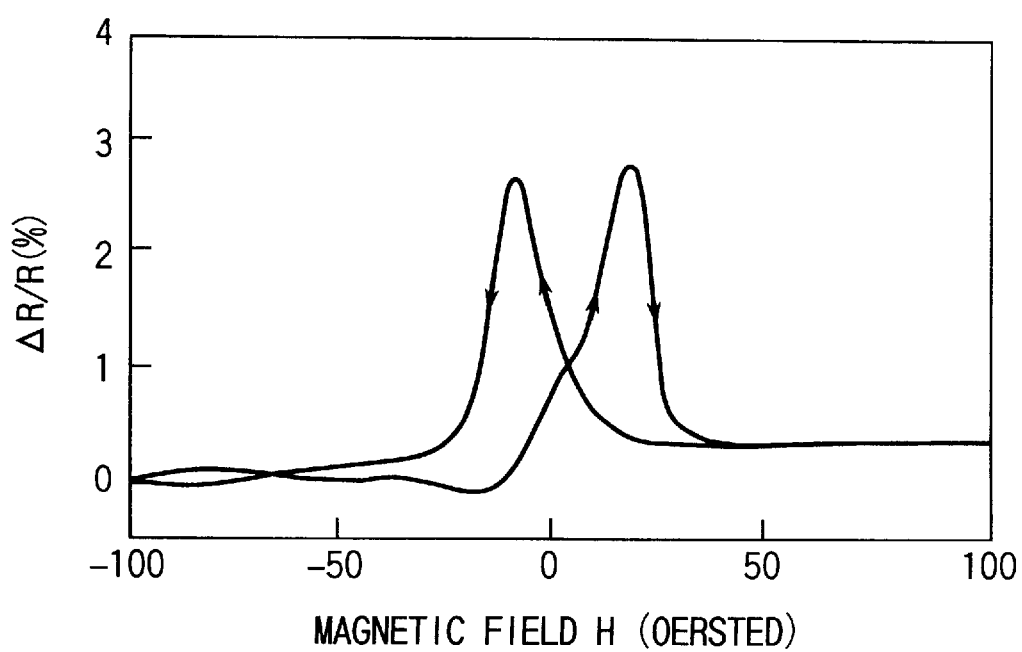
FIG. 4 is a graph showing the rate of change in magnetic resistance of the conventional ferromagnetic tunnel junction element.
Figure 5A:
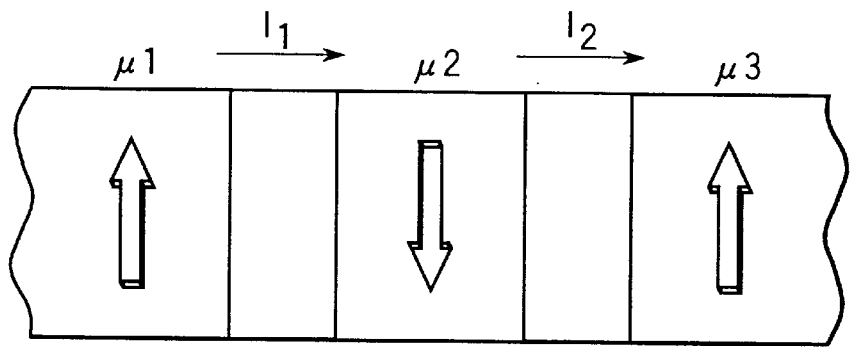
FIG. 5A is a schematic view showing a tunnel junction for explaining the principle of the generation of tunnel magnetoresistance at the moment when a coulomb blockade is revealed at a double tunnel junction.
Figure 5B:
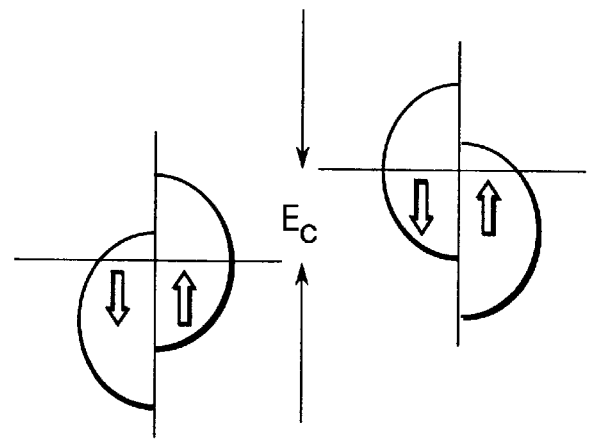
FIG. 5B is a diagram showing a state density of electron for explaining the principle of the generation of tunnel magnetoresistance at the moment when a coulomb blockade is revealed at a double tunnel junction.

FIG. 5A illustrates a tunnel junction for explaining the principle of the generation of tunnel magnetoresistance at the moment when a coulomb blockade is revealed at a double tunnel junction, and FIG. 5B shows a state density of electron at this occasion.

Figure 6A:
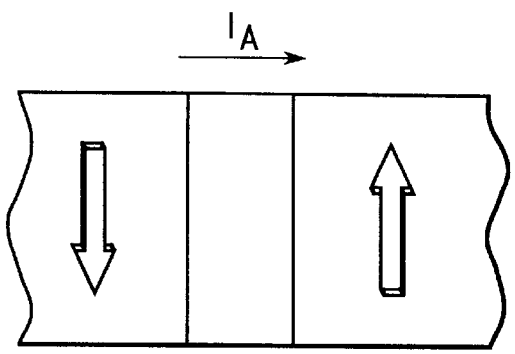
FIG. 6A is a schematic view showing a tunnel junction for explaining the principle of the generation of tunnel magnetoresistance at the moment when a coulomb blockade is revealed at a single tunnel junction.
Figure 6B:
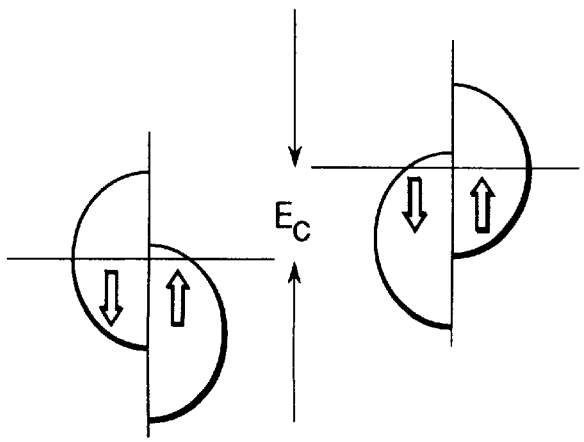
FIG. 6B is a diagram showing a state density of electron for explaining the principle of the generation of tunnel magnetoresistance at the moment when a coulomb blockade is revealed at a single tunnel junction.
Figure 7A:
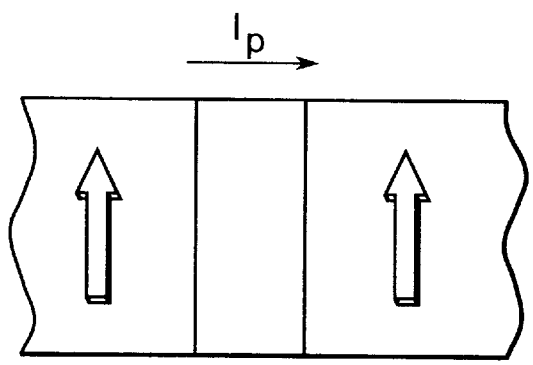
FIG. 7A is a schematic view showing a tunnel junction for explaining the principle of the generation of tunnel magnetoresistance at the moment when a coulomb blockade is revealed at a single tunnel junction.
Figure 7B:
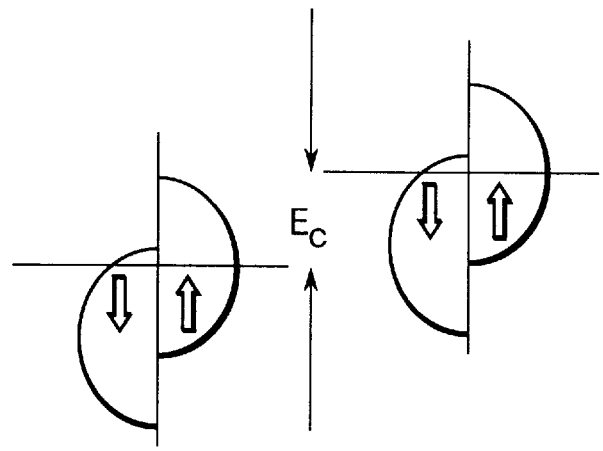
FIG. 7B is a diagram showing a state density of electron for explaining the principle of the generation of tunnel magnetoresistance at the moment when a coulomb blockade is revealed at a single tunnel junction.

FIGS. 6A, 6B, 7A and 7B show schematic views for explaining the principle of the generation of tunnel magnetoresistance at the moment when a coulomb blockade is revealed at a single tunnel junction. Specifically, FIGS. 6A and 7A show respectively a tunnel junction, while FIGS. 6B and 7B show respectively a state density of electron.

The axis of abscissa in each of FIGS. 5B, 6B and. 7B represents Fermi energy, and the arrows in these FIGS. denote the direction of spin of electron.

As shown in FIG. 5A, the magnetization of the couple of first ferromagnetic electrodes is directed in inverse-parallel with the magnetization of the second ferromagnetic electrode sandwiched between the couple of first ferromagnetic electrodes. The charging energy can be represented by $E_c$ as shown in FIG. 5B, and an electron having a spin directed in the same direction is permitted to enter into the junction only when the electron is energized up to a level which is higher by $E_c$ than that of the ordinary tunnel. If it is assumed that the magnetizations of these first and second ferromagnetic electrodes are in inverse-parallel with each other as shown in FIG. 6A in the initial condition, and are in parallel with each other as shown in FIG. 7A under a condition of reversing magnetic field, the rate of change in the magnetoresistance due to the tunneling of electron becomes maximum, when the polarization of spin in this system and the coulomb blockade are taken into account.

Figure 8:
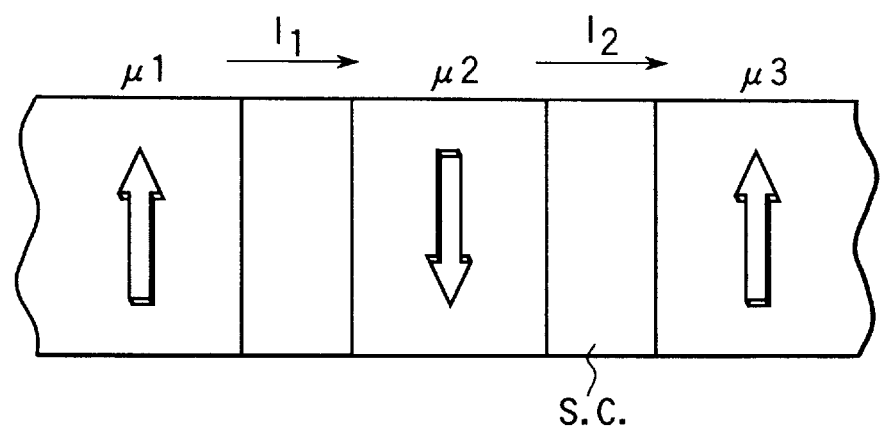
FIG. 8 is a schematic view showing another example of a single tunnel junction.

This invention is not limited to the aforementioned double tunnel junction, but one of the tunnel junctions may be replaced by a Schottky junction as shown in FIG. 8. In FIG. 8, the tunnel junction on right side in the double tunnel junction shown in FIG. 5A, where a current $I_2$ is adapted to pass through is replaced by a Schottky junction. This Schottky junction can be mounted by substituting a semiconductor member S.C. for the insulating member and by interposing the semiconductor member S.C. between one side of the second ferromagnetic electrode and the first ferromagnetic electrode.

According to the theory where all of high-order tunnelings are taken into account, the change of magnetic resistance in the tunnel of this system can be represented by the following formula (7).

$$\frac{\Delta R_0(H)}{R_0(0)} = \frac{R_0(0) - R_0(H)}{R_0(0)} \tag{7}$$

$$= 1 - \frac{R_t(H)}{R_t(0)} \cdot \frac{\int_0^\pi dx K(x,T,R_t(0))}{\int_0^\pi dx K(x,T,R_t(H))}$$

wherein $R_t(0)$ and $R_t(H)$ are a tunnel resistance under zero magnetic field and a tunnel resistance under a magnetic field respectively in a temperature range between not less than a temperature corresponding to a charging energy and not higher than Curie temperature (a temperature under which the coulomb blockade would not be generated); T is an absolute temperature; and K (x, T, $R_t(H)$) represents a formula (8) shown below.

$$K(x,T,R_t(H)) = \exp\left\{ -\frac{E_c}{k_B T} \sum_{l=1}^{\infty} \frac{1-\cos(lx)}{(2\pi l)^2 + \frac{16}{\pi} \frac{E_c}{k_B T} \frac{R_q}{R_T(H)} \int_0^\pi dx K(x,H) \frac{1-\cos(lx)}{1-\cos(x)}} \right\} \tag{8}$$

This value is self-adjustively determined, varying non-linearly from 0 (a complete coulomb blockade) to $\pi$ (no coulomb blockade). By the way, $k_B$ in the formula (8) is Boltzmann's constant. Since $R_T(0) > R_T(H)$ in this case, a relationship represented by the following formula (9) can be established in a region where the coulomb blockade would be revealed, thus enhancing the negative magnetoresistance effect of the ferromagnetic tunnel junction element.

$$K(x, 0)/K(x, H) < 1 \tag{9}$$

This negative magnetoresistance effect becomes most prominent when a higher-order tunneling process is generated due to a quantum fluctuation, and can be expressed by a non-linearity which is proportionate to a power in high-order of $R_q/R_T(H)$. Therefore, in order to take advantage of this non-linearity, it is preferable to select, in different to the ordinary single-electron controlling element, a condition where the coulomb blockade can be appropriately destroyed thereby to allow a micro-current to flow in a coulomb gap, i.e. $R_q/R_T(H) > 0.87$.

Therefore, if the basic unit of element function is constituted by a basic component meeting the aforementioned condition, it would be possible to fabricate a single-electron controlling magnetic element and a composite element (circuit) such as a memory logic, which are capable of exhibiting a large change in tunnel magnetoresistance in conformity with an increase in miniaturization of element. According to the conventional single-electron controlling element, it is presupposed that the coulomb blockade works completely and that a sub-gap current can be forbidden. Whereas, in the case of the element according to this invention, it is designed such that the tunnel junction resistance is minimized so as to positively utilize a non-linear mode to be generated when the coulomb blockade takes place incompletely, so that the number of junction is no more required to be multiplexed as in the case of the conventional single-electron controlling element. Namely, it is possible according to this invention to easily manufacture an element, and to minimize the chip size while allowing the design margin to be enlarged in the fabrication of a composite element (circuit). As a result, it is possible according to this invention to promote the operation speed and at the same time to minimize the power delay product.

This invention will be further explained in detail with reference to drawings.

Figure 9:
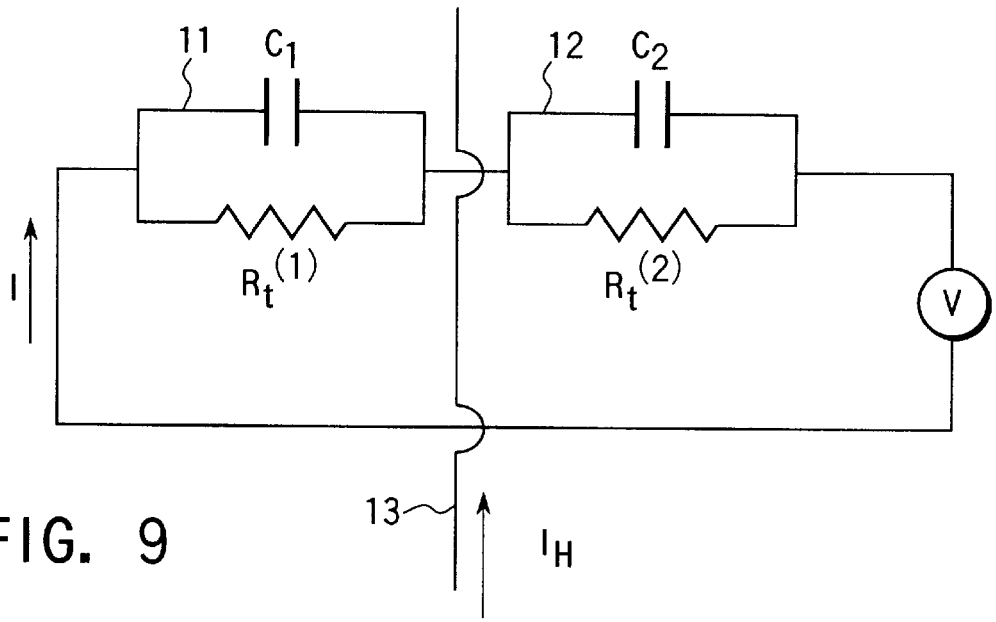
FIG. 9 is a circuit diagram illustrating another example of the single-electron controlling magnetoresistance element according to one embodiment of this invention.
Figure 10A:
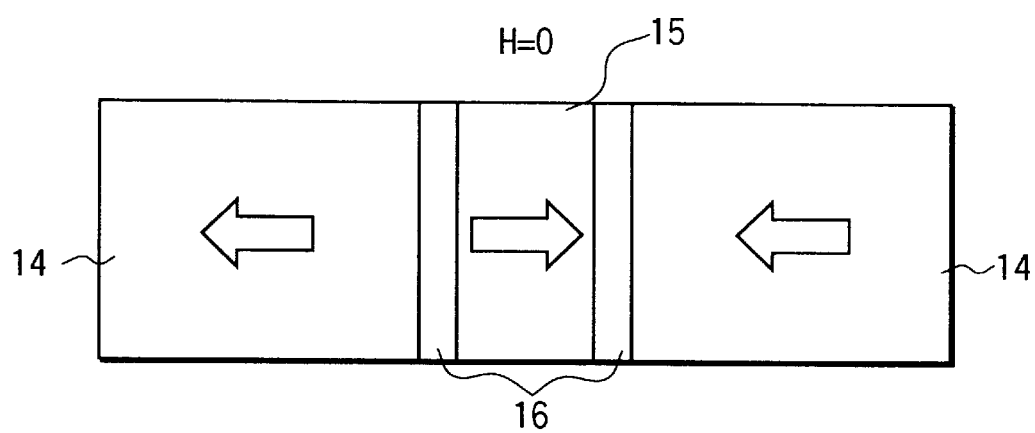
FIGS. 10A and 10B are schematic views showing the tunnel junction of the single-electron controlling magnetoresistance element according to one embodiment of this invention.
Figure 10B:
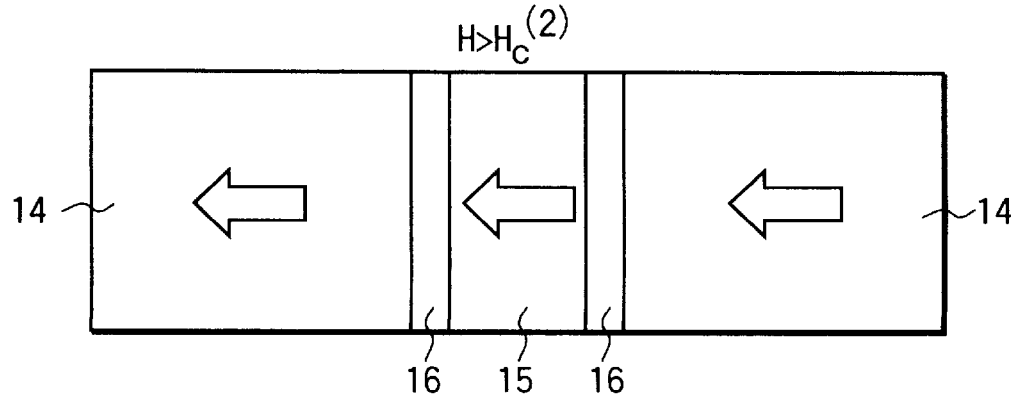

FIG. 9 shows a circuit diagram illustrating one example of the single-electron controlling magnetoresistance element according to this invention, and FIGS. 10A and 10B show schematic views illustrating a tunnel junction of the single-electron controlling magnetoresistance element according to this invention. As shown in FIG. 9, the basic components in the element of this invention comprises a double tunnel junction array consisting of an ultra-fine tunnel junctions 11 and 12 which are connected in series, and a gate (wiring) 13 for generating a reversing magnetic field. The double tunnel junction is formed of three ferromagnetic electrodes as shown in FIG. 10A and 10B, i.e. a couple of first ferromagnetic electrodes 14, and a second ferromagnetic electrode 15 which is sandwiched via a tunnel barrier 16 between the first ferromagnetic electrodes 14. The central electrode (hereinafter referred to as an island) 15 is formed of a soft magnetic film, while the other two electrodes 14 are formed of a hard magnetic film. It is designed that, as shown in FIG. 10A, the magnetization of the first and second ferromagnetic electrodes can take an inverse-parallel state with each other by an interaction of magnetic dipole at least in the region near the junction, and that, as shown in FIG. 10B, the magnetization of the first and second ferromagnetic electrodes can take a parallel state with each other by the inversion of the second ferromagnetic electrode in a magnetic field H exceeding the reversing magnetic field ($Hc^{(2)}$) of the soft magnetic film constituting the second ferromagnetic electrode.

Figure 11:
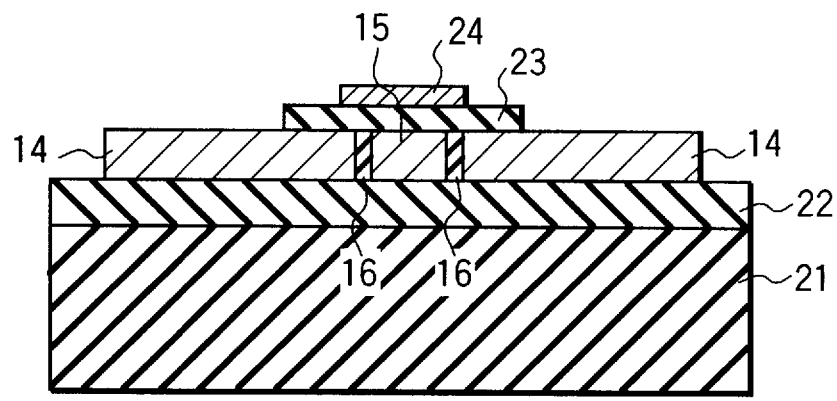
FIG. 11 is a cross-sectional view of one example of the single-electron controlling magnetoresistance element according to this invention.
Figure 12:
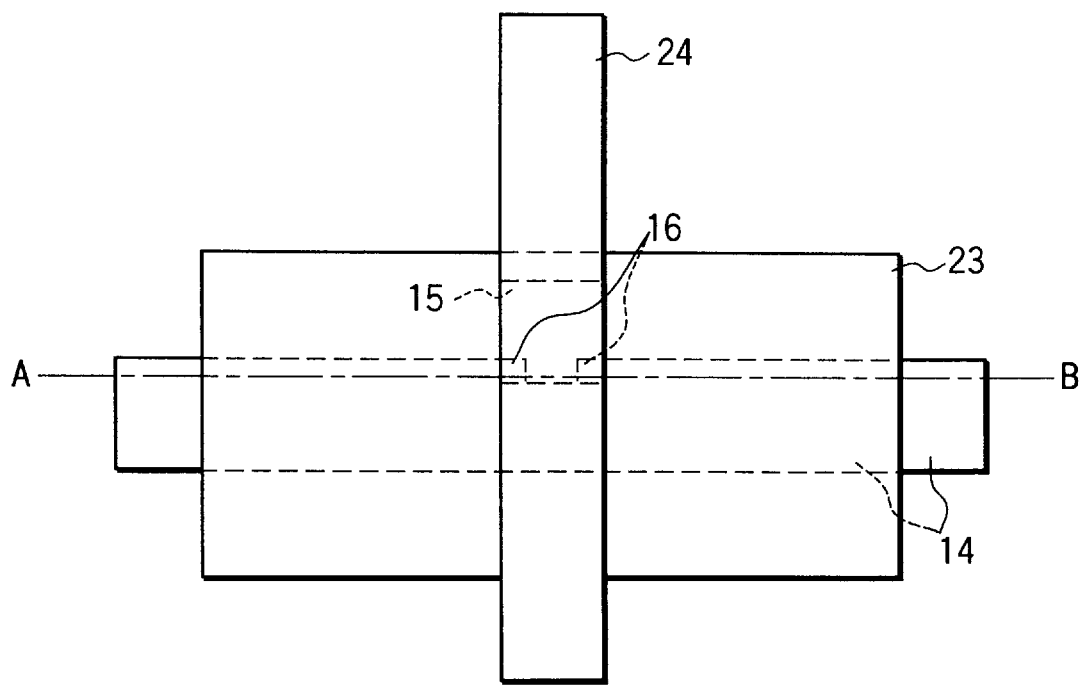
FIG. 12 is a plan view of a single-electron controlling magnetoresistance element according to this invention.

A cross-sectional view of the actual tunnel junction portion is shown in FIG. 11, while the plan view thereof is shown in FIG. 12. The cross-sectional view of FIG. 11 is taken along the line A-B in the plan view shown in FIG. 12.

As shown in FIG. 11, a double tunnel junction comprising the first ferromagnetic electrodes 14, the second ferromagnetic electrode 15 and the tunnel barrier 16 is formed via an SiO$_2$ film 22 on a Si substrate 21. Further, an Al wiring 24 is formed via an SiO$_2$ film 23 on the tunnel junction.

The element having a such structure can be manufactured as follows. First of all, the SiO$_2$ film 22 having a thickness of 200 nm is formed on the Si substrate 21. Then, a nickel film 15 having a thickness of 20 nm, a width of 0.1 μm and a length of 0.1 μm is formed via a mask on the SiO$_2$ film 22 by means of an oblique sputtering method. This nickel film 15 functions as a second ferromagnetic electrode. Subsequently, the surface of the nickel film 15 is oxidized by means of a plasma oxidation method to form an insulating film (NiO film) 16.

Figure 13A:
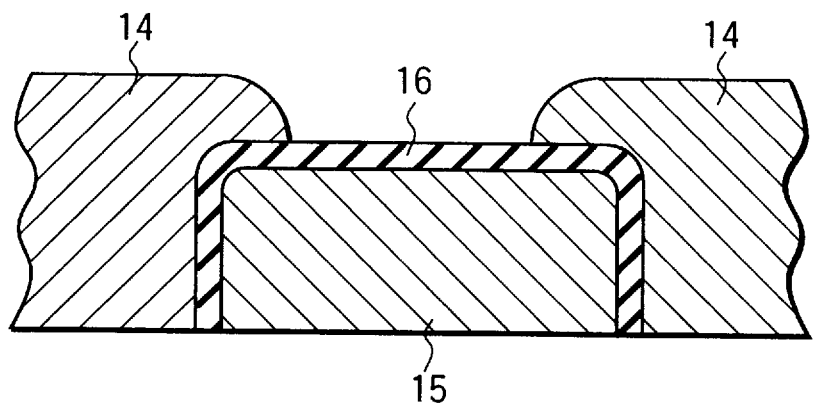
FIGS. 13A and 13B are cross-sectional views each illustrating one example of the process for forming an ultra-fine tunnel junction having a inverse-parallel magnetization in a single-electron controlling magnetoresistance element according to this invention.
Figure 13B:
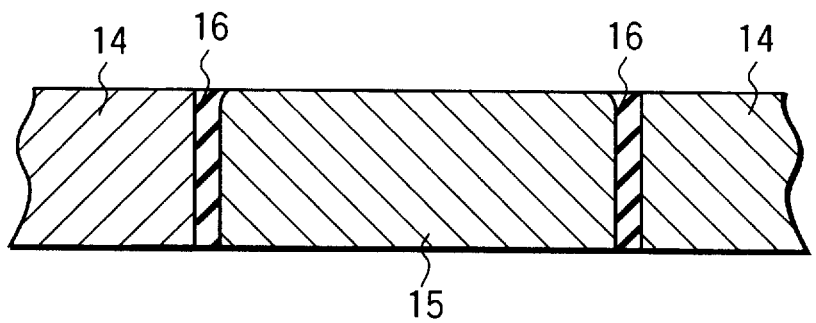

Then, after the mask is dislocated, a Co film 14 having a thickness of 15 nm and a width of 0.1 μm is formed through the mask by means of an inverse oblique sputtering method. The Co film 14 functions as a first ferromagnetic electrode. Specifically, as shown in cross-section in FIG. 13A, a first ferromagnetic electrode 14 is formed on both sides of the second ferromagnetic electrode 15 provided on its surface with an insulating film (NiO film) 16. Then, as shown in FIG. 13B, the surface of the resultant body is subjected to an etch-back until a portion of NiO film 16 which is disposed other than the tunnel junction portion of the second ferromagnetic body is exposed thereby etching away surplus portions of the contacting surface and tunnel barrier layer.

It is possible with this process to minimize the area of the tunnel junction and at the same time to facilitate the interaction of magnetic dipole due to an increase of the exposed portion between the first ferromagnetic electrode 14 and the second ferromagnetic electrode 15 during the temperature rise at the occasion of etch-back. As a result, it becomes easy to cause the magnetization orientations of the first and second ferromagnetic electrodes to take a state of inverse parallel with each other after the formation of the tunnel junction. It is also possible, for the purpose of accelerating the inverse parallel magnetization orientation, to anneal the first and second ferromagnetic electrodes after the etch-back at a suitable temperature.

Then, an SiO$_2$ film 23 having a thickness of 50 nm is formed to entirely cover the double tunnel junction structure, and finally an Al wiring 24 having a thickness of 200 nm and a width of 0.1 μm is formed on the Ni island 15. The charging energy of this system has been estimated as being about 20K as a result of analysis of current/voltage characteristics.

Figure 14:
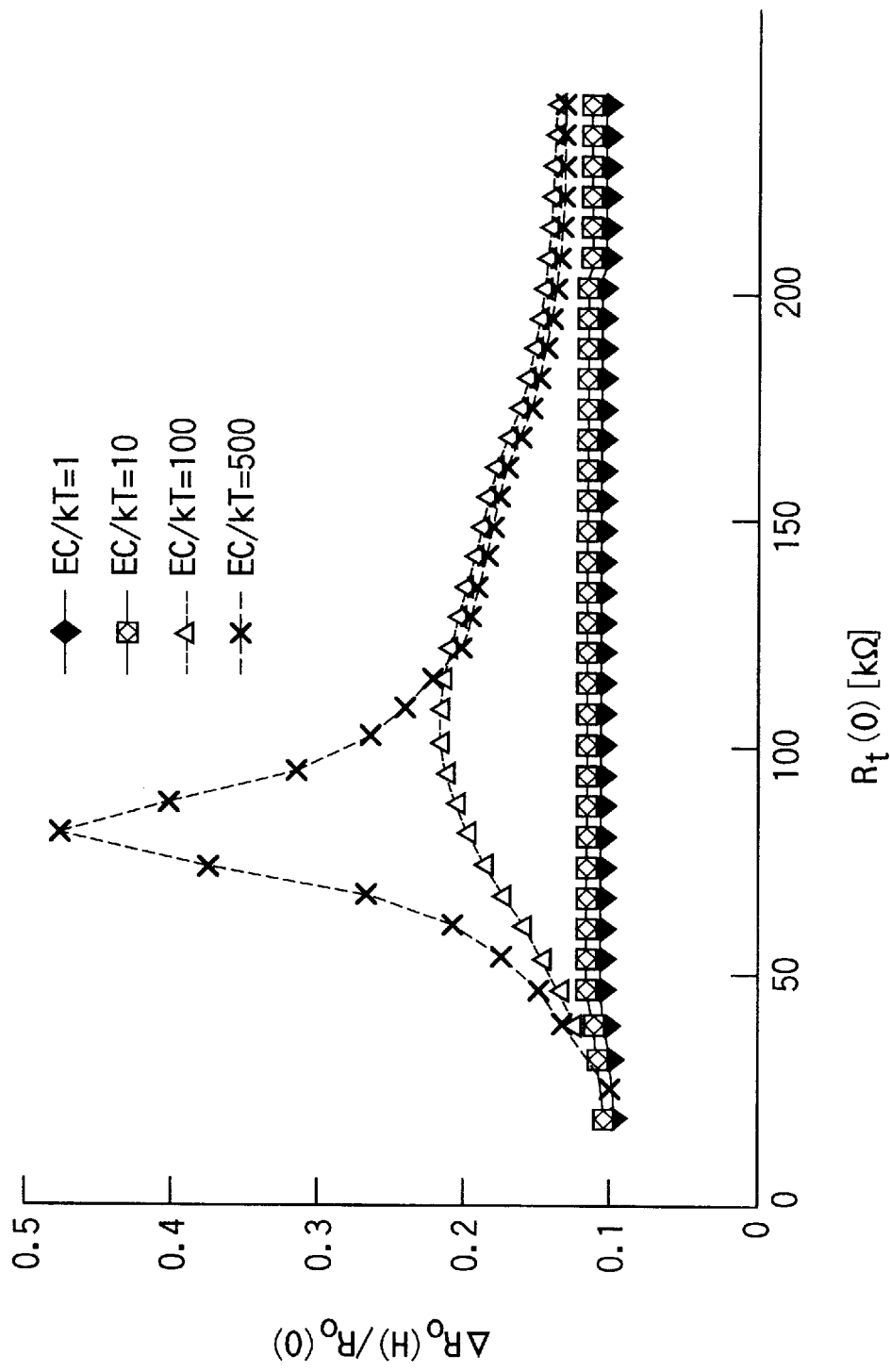
FIG. 14 is a graph illustrating the rate of change in tunnel magnetoresistance in a single-electron controlling magnetoresistance element of double tunnel junction structure.

Then, to this element constructed as mentioned above, a current is passed via the Al wiring 24 until a magnetic field of a magnitude which exceeds the reversion magnetic field is generated so as to measure the maximum rate of change in the magnetic tunnel resistance, $\Delta R_0(H)/R_0(0)$. The results thus obtained are shown in the graph of FIG. 14. In FIG. 14, the curves shown are depicted taking the measured temperature T as a parameter, and the axis of ordinate illustrates the values of magnetic resistance of one tunnel junction at a temperature higher than the charging energy. The tunnel resistance under the zero magnetic field at a temperature sufficiently higher than the charging energy can be represented by the following formula (10).

$$R_t^{(1)} \sim R_t^{(2)} \equiv R_t \tag{10}$$

In this case, the rate of change in magnetic resistance at room temperature is 10%. Herein, a non-linear region where the coulomb blockade takes place incompletely is taken notice of.

Figure 15:
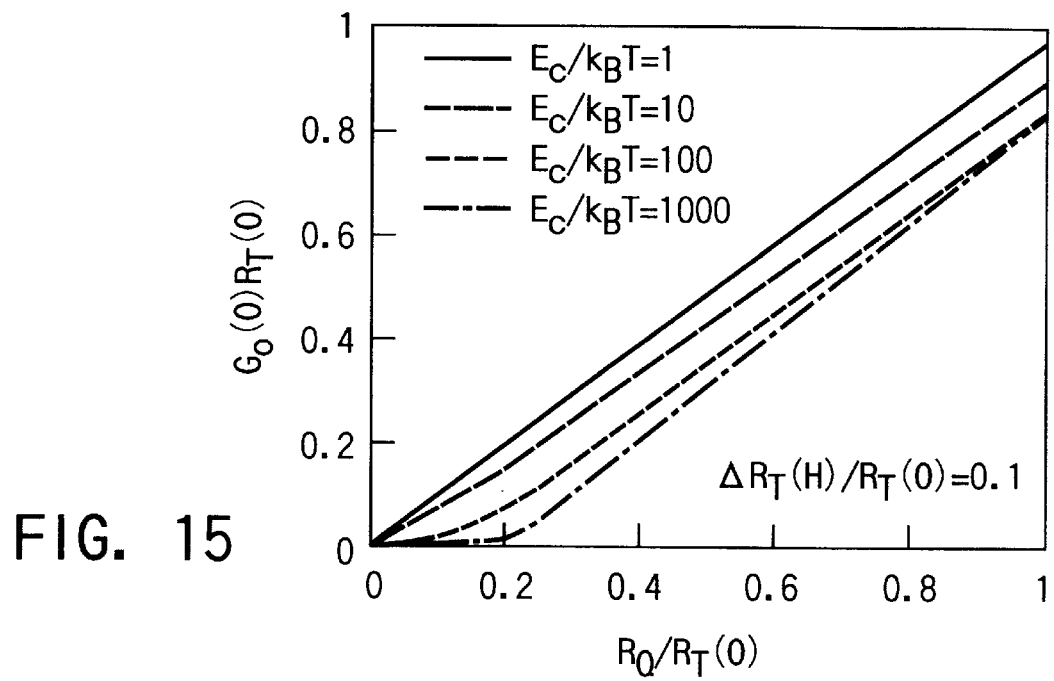
FIG. 15 is a graph illustrating the features of conductance of a tunnel junction.

FIG. 15 illustrates the behavior of conductance $G_0(0)$ of the tunnel junction when the tunnel resistance $R_t(0)$ is changed, the conductance being plotted taking as a parameter the charging energy at the tunnel junction. In FIG. 15, $R_t(0)$ is scaled by $G_0(0)$. As seen from FIG. 15, the larger the $(E_c/k_BT)$ is, the more effectively the effect of non-linearity works. If the resistance of junction changes within the range where the effect of non-linearity works, the magnetic resistance of the junction will be greatly changed. Specifically, when $(E_c/k_BT)$ is 1,000, the rate of change in the magnetic resistance would become nearly 40% in maximum.

Figure 16:
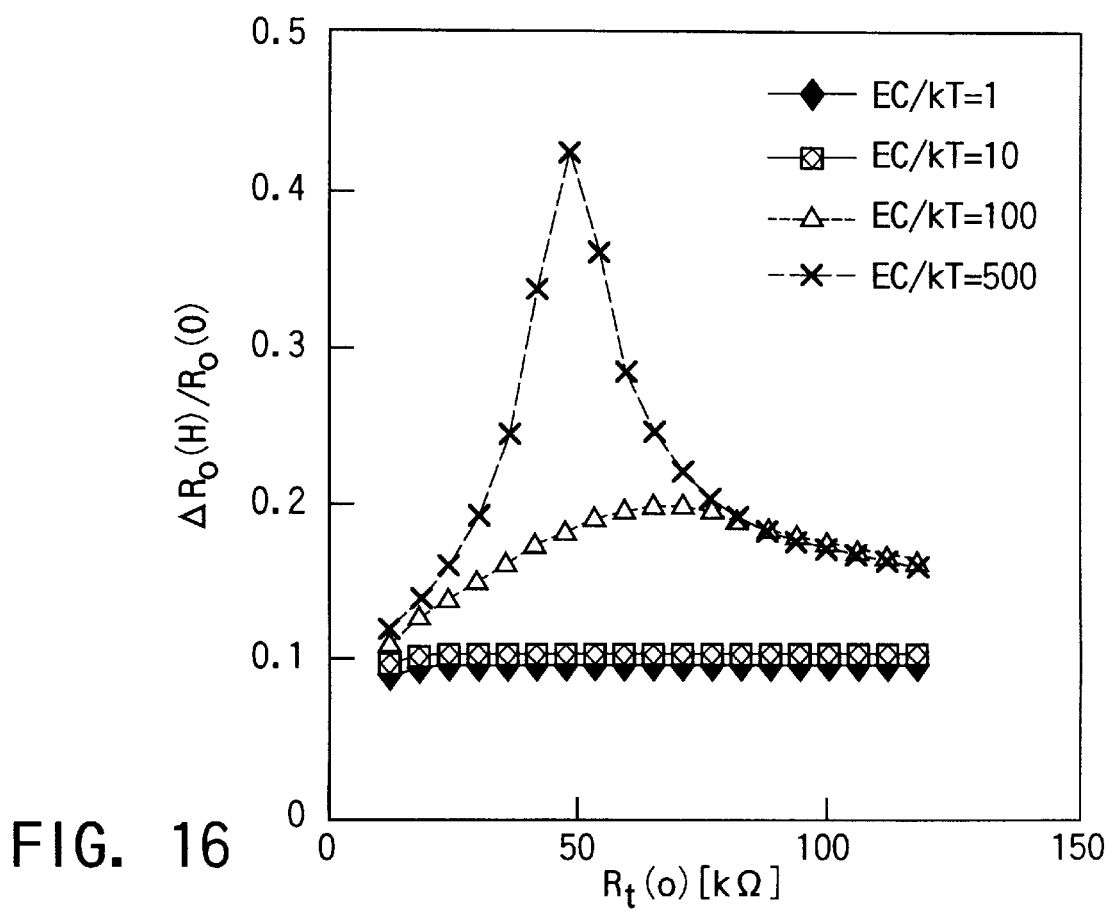
FIG. 16 is a graph illustrating the rate of change in tunnel magnetoresistance in a single-electron controlling magnetoresistance element of triple tunnel junction structure.

FIG. 16 shows the results measured of magnetic resistance of the tunnel in a triple tunnel junction structure which was manufactured in the same method as mentioned above. In this case also, the charging energy is estimated to be about 20K. The tunnel resistance under the zero magnetic field at a temperature sufficiently higher than the charging energy can be represented by the following formula (11).

$$R_t^{(1)} \sim R_t^{(2)} \sim R_t^{(3)} \equiv R_t \tag{11}$$

As seen from FIG. 16, the maximum rate of change in the magnetic tunnel resistance in the triple tunnel junction structure was observed at a resistance which was smaller than that of the double tunnel junction. Specifically, when $(E_c/k_BT)$ is 500, the maximum rate of change in the case of the double tunnel junction structure was observed at a resistance of 80 kΩ, whereas in the case of the triple tunnel junction structure, the maximum rate of change was observed at a resistance of 50 kΩ. The effect of non-linearity representing an incompleteness of the coulomb blockade to be generated from a high-order tunneling would become more difficult to obtain with an increase in multiplicity of the multiple tunneling junction. Therefore, the resistance of each tunnel junction is required to be set to as small as possible.

The tunnel resistance in the case of the single-electron controlling magnetoresistance element of this invention should preferably be in the range of 13 kΩ to 150 kΩ, more preferably 40 kΩ to 100 kΩ. It has been found by the present inventors that there is a relationship between a preferable range of the tunnel resistance and both of thermal energy and charging energy as shown below. Namely, a preferable range of the tunnel resistance $R_t$ can be defined by the following relational expression.

$$R_t \leq 700 \cdot \tan h(\alpha) k\Omega$$

wherein α is a cubic root of the ratio $(k_BT/E_C)$ between a charging energy $(E_C)$ of one electron and a thermal energy $(k_BT)$ at an operation temperature.

In this case, the lower limit of $R_t$ is preferably at least 13 kΩ. As shown in FIGS. 14 and 16, the rate of change on the lower resistance side as viewed from the peak of the curve is sharply decreased, whereas the decrease in rate of change on the higher resistance side is comparatively moderate. Accordingly, it is possible with this relational expression to cover all of the preferable range of tunnel resistance. Moreover, if the tunnel resistance can be confined within this range, a sufficient increase in tunnel magnetic resistance for actual use can be expected irrespective of the number of tunnel junction. Therefore, if the tunnel magnetic resistance is suitably set from the beginning, it is possible to apply the structure of this invention not only to the aforementioned double or triple tunnel junction, but also, if required, to a multiple tunnel junction structure of higher order.

In the embodiments shown in the graphs of FIGS. 14 and 16, the effect of increasing the tunnel magnetic resistance was observed only at a relatively low temperature because of the small charging energy. However, if the capacity junction is minimized by further miniaturizing the tunnel junction structure, it is possible to achieve a large increase in negative tunnel magnetic resistance even at room temperature as the case of low temperature.

The material for the electrode in the magnetic resistant element of this invention is not confined to those employed in the aforementioned example, but may be optionally selected from any materials which capable of exhibiting a high rate of change in the tunnel magnetic resistance. If it is possible to increase the original rate of change in tunnel magnetic resistance, the resistance can be increased non-linearly so that a prominently large rate of change in tunnel magnetic resistance can be obtained. For example, when CoFe is employed as a first magnetic body and $Al_2O_3$ is employed as a tunnel barrier, it is possible to obtain a rate of change of as high as about 20% at 4.2K, or a rate of change of as high as about 15% even at room temperature.

In the foregoing embodiment, a wiring was employed as means for reversing the magnetization and the reversion of magnetization was performed by a magnetic field generated by the wiring. However, this invention is not confined to such an embodiment, but it is also possible to realize the reversion of magnetization by the impression of an electrostatic potential or by the irradiation of light by making use of a suitable material for a central electrode (island).

Figure 17:
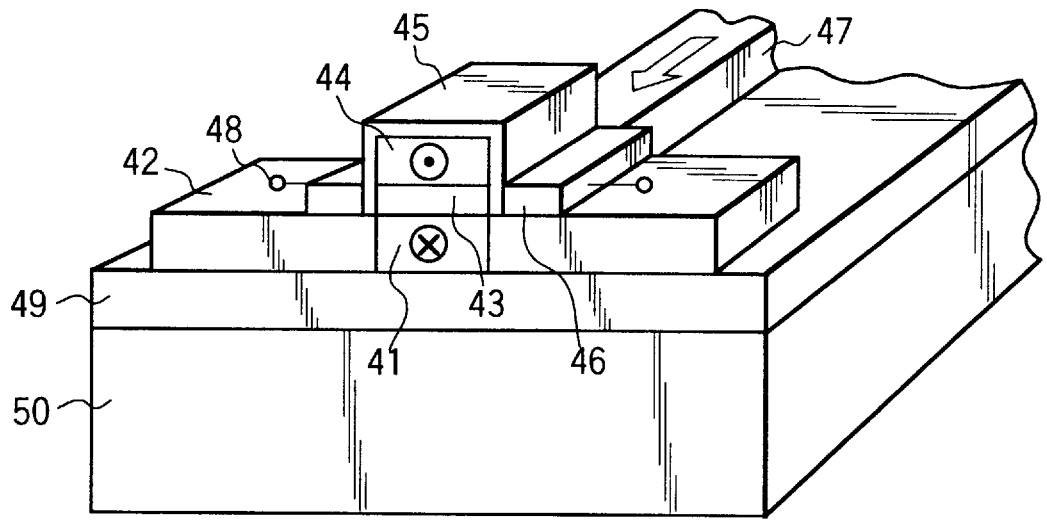
FIG. 17 is a perspective view of another example of the single-electron controlling magnetoresistance element according to this invention.
Figure 18:
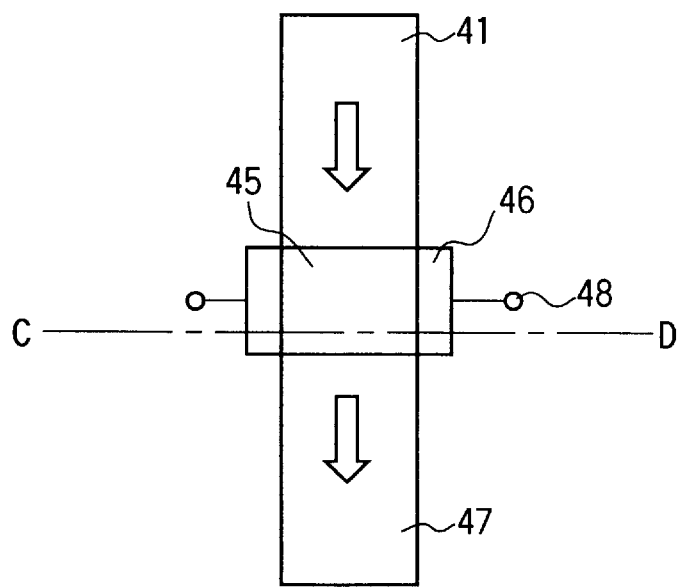
FIG. 18 is a plan view of a single-electron controlling magnetoresistance element according to this invention.

FIG. 17 shows a perspective view of island structure as one example of carrying out the reversion of magnetization by way of impressing an electrostatic potential, and FIG. 18 shows a plan view thereof. The element shown in these FIGS. can be manufactured as follows. Namely, an $SiO_2$ film 42 having a thickness of 50 nm, a width of 200 nm and a length of 100 nm is formed on the $SiO_2$ film 49 which is formed in advance on a SiO substrate 50. Then, the central portion of the $SiO_2$ film 42 is cut off so as to form therein a pattern having a width of 100 nm and a length of 100 nm. Then, a Ni film to be functioned as a second ferromagnetic metal is formed on this cut pattern by means of a sputtering method. Then, the entire upper surface is subjected to an etch-back, thereby forming a structure wherein a second ferromagnetic metal 41 having a thickness of 20 nm, a width of 100 nm and a length of 100 nm is sandwiched by a couple of the $SiO_2$ films 42.

Then, a monocrystalline Si is allowed to be deposited on the second ferromagnetic metal 41 by way of epitaxial growth to form an un-doped Si layer 43 having a thickness of 20 nm, on which a Co film 44 having a thickness of 20 nm and functioning as a third ferromagnetic body is deposited by way of sputtering. Thereafter, the third ferromagnetic body 44 and the un-doped Si layer 43 are patterned into a laminar structure having a width of 100 nm and a length of 100 nm by means of dry etching. The surface exposed after this patterning is then oxidized to form an insulating film 45 having a thickness of 10 nm, and a poly Si gates 46 are formed via the insulating film 45 on both sides of the un-doped Si layer 43.

A Co film 47 functioning as a first ferromagnetic body having a thickness of 20 nm, a width of 100 nm and a length of 100 nm is formed on both sides of the second ferromagnetic body having an oxidized surface so as to form a tunnel junction with the second ferromagnetic body by means of oblique sputtering method. Since an MOS structure is constituted by the un-doped Si layer 43, the insulating film 45 and the poly Si gates 46, the second ferromagnetic body 41 and the third ferromagnetic body 44 are designed to be metallically connected through a channel with each other when the gate voltage 48 is impressed thereon.

The section shown in FIG. 17 is taken along the line C-D of FIG. 18, and the arrow shown in FIG. 17 indicates the direction of magnetization of the first to third ferromagnetic bodies. As shown in these FIGS., the direction of magnetization of the second ferromagnetic body is inverse-parallel with the direction of magnetization of the first ferromagnetic body, whereas the direction of magnetization of the third ferromagnetic body is parallel with the direction of magnetization of the first ferromagnetic body. When a gate voltage is impressed so as to cause a metallic connection to be generated between the second ferromagnetic body and the third ferromagnetic body, the direction of magnetization of the second ferromagnetic body becomes parallel with the direction of magnetization of the third ferromagnetic body. Therefore, a reversal of magnetization will be brought about in the first ferromagnetic body. In this case, a change in tunnel junction resistance can be brought about in the same manner by a change in gate voltage as the aforementioned example where a magnetoresistance change was brought about by the reversal of magnetization using a wiring.

The magnetization of the third ferromagnetic body may not necessarily be parallel with the magnetization of the first ferromagnetic body, i.e. it may be inverse-parallel with the magnetization of the first ferromagnetic body for some reason or other, for example because of an employment of a different substance. It is possible in this case to optimize for the realization of antiferromagnetic connection by changing the film thickness of the epitaxial Si film.

Although this invention has been explained taking a double or triple junction as an example, they may be variously modified within the gist of this invention. For example, the memory/logic circuit that has been employed in the conventional ferromagnetic magnetoresistance element can be replaced by a magnetoresistance element of this invention as a basic component, thereby to improve the performance of element in the sense that a logic amplitude can be increased with the advancements of miniaturization and integration of element.

As explained above, it is possible according to this invention to provide a single-electron controlling magnetoresistance element having an element structure/operational mode which is capable of achieving an enhanced performance through an increased miniaturization and integration as compared with the existing semiconductor element. Further, it is possible with the employments of this element and the operation mode thereof to non-linearly increase the logic amplitude of an ultra-fine ferromagnetic tunnel junction element. Therefore, not only the performance of the ferromagnetic tunnel element unit but also the performance of memory or composite circuit such as a logic circuit, where the ferromagnetic tunnel element unit is incorporated therein as a basic component, can be prominently improved. Furthermore, the freedom in designing a system can be expected to be expanded, thus making this invention valuable in industrial viewpoint.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A single-electron controlling magnetoresistance element which comprises;

a couple of first ferromagnetic bodies each magnetized in a first direction;

a second ferromagnetic body magnetized in a second direction in an initial direction and sandwiched between said couple of first ferromagnetic bodies with a tunnel junction interposed therebetween respectively; and means for directing the magnetization direction of said second ferromagnetic body to a direction different from said second direction;

wherein a charging energy $E_c$ of a single electron in at least one of said tunnel junctions interposed between said first ferromagnetic body and said second ferromagnetic body meets the following conditions:

$$E_c >> k_B T \tag{2}$$

$$E_c >> h/R_t C \tag{3}$$

wherein $k_B T$ is a thermal energy at an operation temperature, h is a Planck's constant, $R_t$ is a junction tunnel resistance, and C is a junction capacity.

2. The single-electron controlling magnetoresistance element according to claim 1, wherein said second direction defining a direction of magnetization of said second ferromagnetic body is opposite in direction from said first direction defining a direction of magnetization of said first ferromagnetic body; and said means for directing the magnetization direction is adapted to function to reverse the magnetization direction of said second ferromagnetic body so as to direct it in the same direction as that of said first direction.

3. The single-electron controlling magnetoresistance element according to claim 2, wherein said means for directing the magnetization direction is formed via an insulating film on said second ferromagnetic body.

4. The single-electron controlling magnetoresistance element according to claim 3, wherein said means for directing the magnetization direction is disposed to intercross rectangularly with said second direction of magnetization.

5. The single-electron controlling magnetoresistance element according to claim 4, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio $(k_B T/E_C)$ between a charging energy $(E_C)$ of one electron and a thermal energy $(k_B T)$ at an operation temperature.

6. The single-electron controlling magnetoresistance element according to claim 1, wherein said second direction defining a direction of magnetization of said second ferromagnetic body is the same in direction with said first direction defining a direction of magnetization of said first ferromagnetic body; and said means for directing the magnetization direction is adapted to function to reverse the magnetization direction of said second ferromagnetic body.

7. The single-electron controlling magnetoresistance element according to claim 6, wherein said means for directing the magnetization direction is formed via an insulating film on said second ferromagnetic body.

8. The single-electron controlling magnetoresistance element according to claim 7, wherein said means for directing the magnetization direction is disposed to intercross rectangularly with said second direction of magnetization.

9. The single-electron controlling magnetoresistance element according to claim-8, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio $(k_B T/E_C)$ between a charging energy $(E_C)$ of one electron and a hermal energy $(k_B T)$ at an operation temperature.

10. The single-electron controlling magnetoresistance element according to claim 1, wherein said means for directing the magnetization direction is formed via an insulating film on said second ferromagnetic body.

11. The single-electron controlling magnetoresistance element according to claim 10, wherein said means for directing the magnetization direction is disposed to intercross rectangularly with said second direction of magnetization.

12. The single-electron controlling magnetoresistance element according to claim 11, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio $(k_B T/E_C)$ between a charging energy $(E_C)$ of one electron and a thermal energy $(k_B T)$ at an operation temperature.

13. The single-electron controlling magnetoresistance element according to claim 1, wherein said means for directing the magnetization direction is disposed to intercross rectangularly with said second direction of magnetization.

14. The single-electron controlling magnetoresistance element according to claim 13, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio $(k_B T/E_C)$ between a charging energy $(E_C)$ of one electron and a thermal energy $(k_B T)$ at an operation temperature.

15. The single-electron controlling magnetoresistance element according to claim 1, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio $(k_B T/E_C)$ between a charging energy $(E_C)$ of one electron and a thermal energy $(k_B T)$ at an operation temperature.

16. A single-electron controlling magnetoresistance element which comprises;

a couple of first ferromagnetic bodies each magnetized in a first direction;

a second ferromagnetic body magnetized in a second direction in an initial direction and sandwiched between said couple of first ferromagnetic bodies;

a tunnel junction disposed on one side of said second ferromagnetic body which faces one of said first ferromagnetic bodies; and means for directing the magnetization direction of said second ferromagnetic body to a direction different from said second direction;

wherein a charging energy $E_c$ of a single electron in said tunnel junction interposed between said first ferromagnetic body and said second ferromagnetic body meets the following conditions:

$$E_c >> k_B T \tag{2}$$

$$E_c >> h/R_t C \tag{3}$$

wherein $k_BT$ is a thermal energy at an operation temperature, h is a Planck's constant, $R_t$ is a junction tunnel resistance, and C is a junction capacity.

17. The single-electron controlling magnetoresistance element according to claim 16, wherein said second direction defining a direction of magnetization of said second ferromagnetic body is opposite in direction from said first direction defining a direction of magnetization of said first ferromagnetic body; and said means for directing the magnetization direction is adapted to function to reverse the magnetization direction of said second ferromagnetic body so as to direct it in the same direction as that of said first direction.

18. The single-electron controlling magnetoresistance element according to claim 17, wherein said means for directing the magnetization direction is formed via an insulating film on said second ferromagnetic body.

19. The single-electron controlling magnetoresistance element according to claim 18, wherein said means for directing the magnetization direction is disposed to intercross rectangularly with said second direction of magnetization.

20. The single-electron controlling magnetoresistance element according to claim 19, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio ($k_BT/E_C$) between a charging energy ($E_C$) of one electron and a thermal energy ($k_BT$) at an operation temperature.

21. The single-electron controlling magnetoresistance element according to claim 16, wherein said second direction defining a direction of magnetization of said second ferromagnetic body is the same in direction with said first direction defining a direction of magnetization of said first ferromagnetic body; and said means for directing the magnetization direction is adapted to function to reverse the magnetization direction of said second ferromagnetic body.

22. The single-electron controlling magnetoresistance element according to claim 21, wherein said means for directing the magnetization direction is formed via an insulating film on said second ferromagnetic body.

23. The single-electron controlling magnetoresistance element according to claim 22, wherein said means for directing the magnetization direction is disposed to intercross rectangularly with said second direction of magnetization.

24. The single-electron controlling magnetoresistance element according to claim 23, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio ($k_BT/E_C$) between a charging energy ($E_C$) of one electron and a thermal energy ($k_BT$) at an operation temperature.

25. The single-electron controlling magnetoresistance element according to claim 16, wherein said means for directing the magnetization direction is formed via an insulating film on said second ferromagnetic body.

26. The single-electron controlling magnetoresistance element according to claim 25, wherein said means for directing the magnetization direction is disposed to intercross rectangularly with said second direction of magnetization.

27. The single-electron controlling magnetoresistance element according to claim 26, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio ($k_BT/E_C$) between a charging energy ($E_C$) of one electron and a thermal energy ($k_BT$) at an operation temperature.

28. The single-electron controlling magnetoresistance element according to claim 16, wherein said means for directing the magnetization direction is disposed to intercross rectangularly with said second direction of magnetization.

29. The single-electron controlling magnetoresistance element according to claim 28, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio ($k_BT/E_C$) between a charging energy ($E_C$) of one electron and a thermal energy ($k_BT$) at an operation temperature.

30. The single-electron controlling magnetoresistance element according to claim 16, wherein each tunnel resistance $R_t$ in said tunnel junction is within the range defined by the following relational expression:

$$R_t \leq 700 \cdot \tan h(\alpha) k\Omega$$

wherein $\alpha$ is a cubic root of the ratio ($k_BT/E_C$) between a charging energy ($E_C$) of one electron and a thermal energy ($k_BT$) at an operation temperature.

31. A single-electron controlling magnetoresistance element which comprises;

a couple of first ferromagnetic bodies each magnetized in a first direction;

a second ferromagnetic body magnetized in a second direction opposite to said first direction and sandwiched between said couple of first ferromagnetic bodies with a tunnel junction interposed therebetween respectively; and magnetization-inversion means disposed on said second ferromagnetic body for inverting the magnetization direction of said second ferromagnetic body so as to direct the magnetization direction of said second direction in the same direction as that of said first direction;

wherein a charging energy $E_c$ of a single electron in at least one of said tunnel junctions interposed between said first ferromagnetic body and said second ferromagnetic body meets the following conditions, and a tunnel resistance at each tunnel junction is in the range of 13 k$\Omega$ to 150 k$\Omega$:

$$E_c >> k_BT \quad (2)$$

$$E_c >> h/R_tC \quad (3)$$

wherein $k_BT$ is a thermal energy at an operation temperature, h is a Planck's constant, $R_t$ is a junction tunnel resistance, and C is a junction capacity.

* * * * *